(12) United States Patent
Jones (10) Patent No.: US 8,576,082 B2
(45) Date of Patent: Nov. 5, 2013

(54) BUSWAY JOINT PARAMETER DETECTION SYSTEM

(75) Inventor: David L. Jones, Kennesaw, GA (US)

(73) Assignee: Jones Group Forensic Engineers, Kennesaw, GA (US)

( * ) Notice: Subject to any disclaimer, the term of this patent is extended or adjusted under 35 U.S.C. 154(b) by 642 days.

(21) Appl. No.: 12/836,634

(22) Filed: Jul. 15, 2010

(65) Prior Publication Data

US 2012/0013471 A1    Jan. 19, 2012

(51) Int. Cl.
*G08B 17/00* (2006.01)

(52) U.S. Cl.
USPC .................. 340/584; 340/686.6; 340/692

(58) Field of Classification Search
USPC ......... 340/584, 635, 540, 588, 648, 657, 679, 340/682–683, 589, 601–602, 636.18, 686.6, 340/692
See application file for complete search history.

(56) References Cited

U.S. PATENT DOCUMENTS

| | | |
|---|---|---|
| 3,609,215 A | 9/1971 | Giger, Jr. et al. |
| 3,681,509 A | 8/1972 | Johnston et al. |
| 4,018,497 A | 4/1977 | Dulanchuk |
| 4,804,804 A | 2/1989 | Hibbert et al. |
| 4,929,801 A | 5/1990 | Hibbert |
| 4,950,841 A | 8/1990 | Walker et al. |
| 5,412,324 A | 5/1995 | Goldman et al. |
| 5,619,014 A | 4/1997 | Faulkner |
| 5,629,870 A | 5/1997 | Farag et al. |
| 5,828,006 A | 10/1998 | Graham et al. |
| 5,854,445 A | 12/1998 | Graham et al. |
| 6,300,767 B1 | 10/2001 | Kliman et al. |
| 6,483,289 B2 * | 11/2002 | Reid ........................ 324/115 |
| 6,892,317 B1 | 5/2005 | Sampath et al. |
| 6,970,003 B2 * | 11/2005 | Rome et al. ............... 324/718 |
| 7,010,459 B2 | 3/2006 | Eryurek et al. |
| 7,203,622 B2 | 4/2007 | Pan et al. |
| 7,272,516 B2 | 9/2007 | Wang et al. |
| 7,330,096 B2 | 2/2008 | Shah et al. |
| 7,473,116 B2 * | 1/2009 | Dudhwala et al. ......... 439/212 |
| 7,495,876 B2 * | 2/2009 | Dunne et al. ............... 361/103 |
| 7,496,473 B2 | 2/2009 | Lenz et al. |

(Continued)

FOREIGN PATENT DOCUMENTS

| | | |
|---|---|---|
| EP | 2068412 A2 | 6/2009 |
| JP | 55088145 A | 7/1980 |

(Continued)

OTHER PUBLICATIONS

KIPO: "Notification or Trasmittal of the International Search Report and the Written Opinion of the International Searching Authority, or the Declaration" (ISA 220, ISA 210 and ISA 237), issued in corresponding PCT case, Feb. 17, 2012.

*Primary Examiner* — Daniel Previl
(74) *Attorney, Agent, or Firm* — Bryan W. Bockhop (57) ABSTRACT

A system for detecting an improperly secured busway joint in an electrical distribution busway includes a busway joint parameter sensor, a transmission circuit and a remote computer. The busway joint parameter sensor is disposed so as to sense a selected parameter of the busway joint. The transmission circuit is in data communication with the busway joint parameter sensor and is configured to transmit real time busway joint parameter data. The remote computer is in data communication with the transmission circuit and is configured to present an indication upon detection of abnormal real time busway joint parameter data.

24 Claims, 5 Drawing Sheets

(56) References Cited

U.S. PATENT DOCUMENTS

| | | |
|---|---|---|
| 7,517,235 B2 | 4/2009 | Bagewadi et al. |
| 7,557,309 B2 | 7/2009 | Ross et al. |
| 7,646,308 B2 * | 1/2010 | Paoletti et al. ............ 340/635 |
| 2002/0046864 A1 | 4/2002 | Bellino et al. |
| 2003/0172002 A1 | 9/2003 | Spira et al. |
| 2005/0125197 A1 | 6/2005 | Duron et al. |
| 2008/0094210 A1 | 4/2008 | Paradiso et al. |
| 2009/0012398 A1 | 1/2009 | Zhang et al. |
| 2009/0109021 A1 | 4/2009 | Paoletti et al. |
| 2009/0145625 A1 | 6/2009 | Bhathija et al. |
| 2009/0191739 A1 | 7/2009 | Jur et al. |
| 2009/0196012 A1 | 8/2009 | Jur et al. |

FOREIGN PATENT DOCUMENTS

| | | |
|---|---|---|
| JP | P2004-5482 A | 1/2004 |
| JP | 2005518538 A | 6/2005 |
| JP | 2006277185 A | 10/2006 |
| JP | 2009003561 A | 1/2009 |
| KR | 10-2006-0069639 | 6/2006 |
| WO | 97/43657 A1 | 11/1997 |
| WO | 98/29243 A1 | 7/1998 |
| WO | 99/43066 A1 | 8/1999 |
| WO | 00/62389 A1 | 10/2000 |
| WO | 2006/026749 A1 | 3/2006 |
| WO | 2008/094608 A2 | 8/2008 |
| WO | 2008/094757 A1 | 8/2008 |
| WO | 2008/148075 A1 | 12/2008 |

* cited by examiner

BUSWAY JOINT PARAMETER DETECTION SYSTEM

BACKGROUND OF THE INVENTION

1. Field of the Invention

The present invention relates to electrical distribution systems and, more specifically, to a system for detecting parameters in a busway joint used in an electrical distribution system.

2. Description of the Related Art

Electrical distribution systems within typical buildings (and other structures, such as industrial facilities, power generation facilities and outdoor applications, etc.) rely on a number of different systems to transmit electrical power throughout the building. One type of system used for this purpose includes a power busway for distribution of electrical energy within building and other facilities. A power busway is an engineered product that includes bare or insulated bus conductors (in the form of bars, rounds or tubes) in an overall protective metallic housing. The busway is manufactured in lengths of typically ten feet or less, which are joined together in the field during installation using a bolt-secured busway joint that is secured with one or more joint bolts. The construction details of busway and busway joints vary from manufacturer to manufacturer but one thing remains constant—the bolted busway joint must be properly installed for the busway to achieve its designed operation and service life. Manufacturers have routinely relied on joint bolt torque as the controlling variable for proper installation. However, installing contractors often fail to torque the busway joint bolts properly. Even though some manufacturers have introduced twist-off torque control bolt heads in an attempt assure proper installation, many errors are still made during the installation phase for a number of common reasons and many end-users do not routinely perform adequate preventive maintenance on busway systems.

Notably, a loose busway joint is frequently hard to detect. It will usually not fail during the initial operation or be detected during testing of the busway. In many cases, a completely loose joint can survive for several years prior to catastrophic failure.

Many busway manufacturers and industry groups recommend that joint bolt torque be checked at least annually. A joint bolt torque check can only be performed while the busway is de-energized. Since a busway is likely serving a large part of a building or facility, management is reluctant to de-energize the busway for maintenance causing a multi-hour outage for its tenants or production operations. Many commercial tenants or industrial processes operate 24 hours a day and utilize critical equipment that must not be interrupted. A typical short shutdown may cost a building owner $100 k in direct and indirect costs. Thus, joint bolt torque checks are often foregone.

A loose joint will operate with a higher than normal temperature due to the poor electrical contact in the joint surfaces. Most manufacturers and industry groups now recommend that an infrared (IR) survey be conducted periodically to assess busway system joints. A major advantage of the IR survey is that it can be conducted while the busway is still energized. IR surveys are most common only in the most high end users and critical systems.

Still, IR surveys do not detect all busway joint faults. An IR survey can easily fail to identify a troubled joint if proper procedures are not followed. Also, the survey must be conducted when the busway is under a high electrical load (so that the inadequate joints will overheat to the point of detection). In a large building, a survey usually will be conducted over a full day with the result that some parts of the busway may be surveyed while under less than a high load. Also, an IR survey is usually only conducted no more frequently than once per year (an sometimes as infrequently as every two to four years and in some cases not at all) due to high costs or the failure to perceive a need to perform such surveys. Many problems can develop in a period of months. An incipient problem can develop from IR-undetectable to failure in less than the typical inspection interval.

Therefore, there is a need for a system that monitors busway joints on a real time basis.

SUMMARY OF THE INVENTION

The disadvantages of the prior art are overcome by the present invention which, in one aspect, is a system for detecting an improperly secured busway joint in an electrical distribution busway that includes a busway joint parameter sensor, a transmission circuit and a remote computer. The busway joint parameter sensor is disposed so as to sense a selected parameter of the busway joint. The transmission circuit is in data communication with the busway joint parameter sensor and is configured to transmit real time busway joint parameter data. The remote computer is in data communication with the transmission circuit and is configured to present an indication upon detection of abnormal real time busway joint parameter data.

In another aspect, the invention is a device for reporting a busway joint abnormality to a remote computer that includes a busway joint parameter sensor that is disposed so as to sense a selected parameter of the busway joint. A transmitter is configured to transmit data from the busway joint parameter sensor to the remote computer.

In yet another aspect, the invention is a method of detecting an improperly secured busway joint in an electrical distribution busway, in which a parameter of the busway joint is continuously sensed with a busway joint parameter sensor that is disposed adjacent to the busway joint. Data regarding the parameter is transmitted to a remote computer. The computer determines when the data indicate that the parameter is abnormal. An indication is presented on a computer interface when the parameter is abnormal.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on." Also, as used herein, "global computer network" includes the Internet. Also, as used herein, a "busway joint" is anything used in a busway system to connect one conductor to another conductor in a busway system. For example, busway joints include: bolted busway joints of the type shown in FIG. 1; spring-loaded plug-in receptacles and switches coupled thereto used to tap off power from a busway (e.g., spring-loaded plug-in stabs and mating receptacles associated with plug-in devices used to tap power from a busway); connections bolted to a busway; and any other type of device coupled to a busway.

One embodiment includes a distributed system configured to monitor busway bolt temperature in real time and assert an alarm when a temperature, or temperature trend, indicates that the busway joint is not properly secured. The system includes a plurality of busway joint parameter sensors, each configured to sense a parameter of a different joint. The parameter could include, for example, a busway joint bolt temperature or a joint bolt preload. The sensors communicate joint parameter data with a central server. In one embodiment, this communication occurs via a mesh network. In another embodiment, communication is via a hard-wired connection between the sensors and the server. The system takes into account such factors as busway current, ambient temperature, ambient moisture and position of the joint along a busway to detect anomalies.

Figure 1:
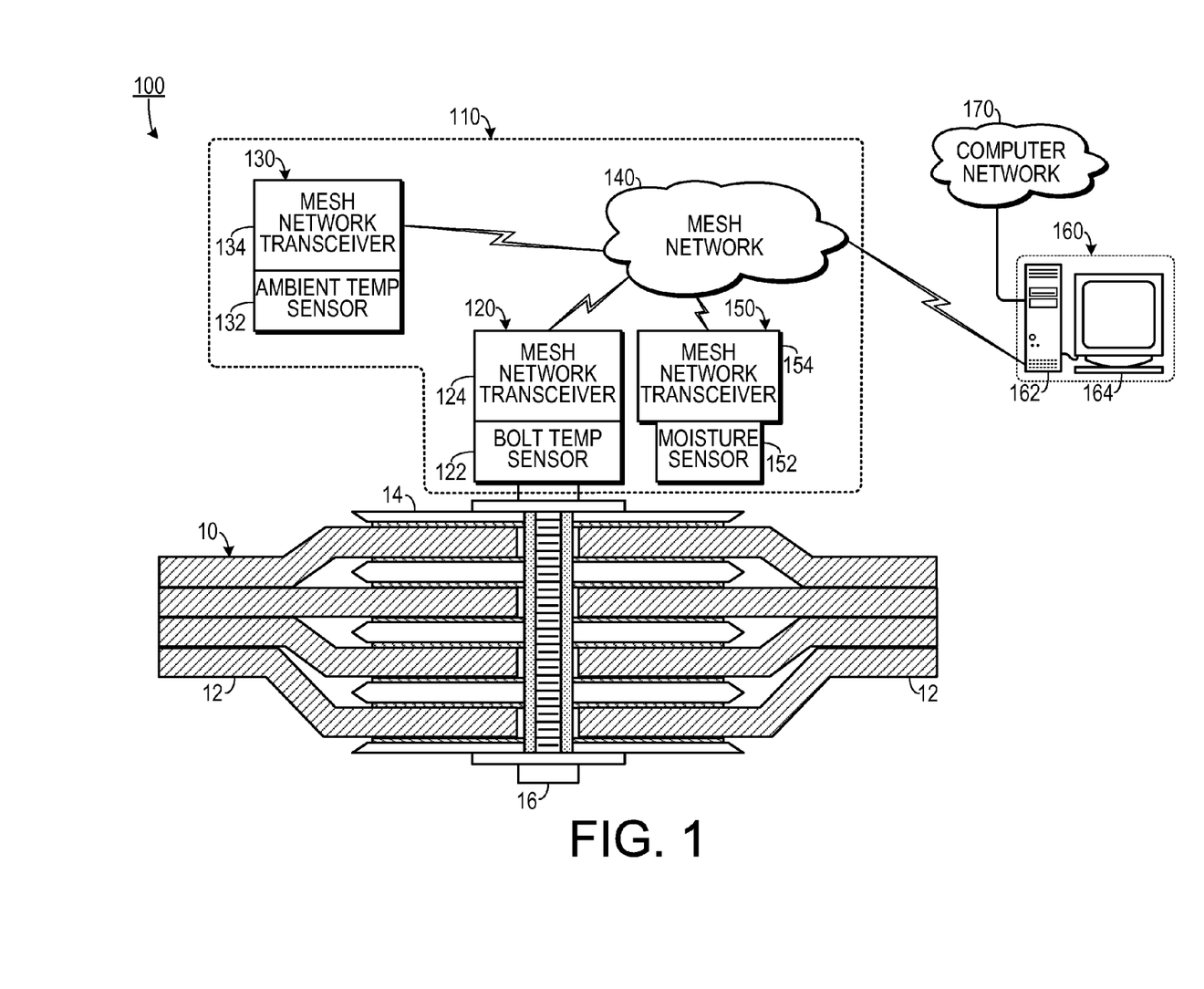
FIG. 1 is a schematic diagram of a first embodiment of a busway joint parameter detection system.

As shown in FIG. 1, one embodiment is a system 100 configured to detect improperly secured bolts 16 used to couple busway segments 12 to each other at busway joints 14 in a busway system 10. A local bolt sensing unit 110 is disposed in the area of each joint 14 and communicates data regarding the bolt 16 to a central server unit 160. The central server unit 160, which can include a processor 162 and an output (such as a display 160, a conventional control and alarm panel, an audible alarm and combinations of these outputs), may be coupled to a computer network 170 (e.g., a global computer network) to provide data to remote locations.

The local bolt sensing unit 110 includes a bolt temperature sensing unit 120, which includes a bolt temperature sensor 122 (which, in this embodiment, is affixed to the bolt) and a transceiver for communicating bolt temperature data to the central server unit 160. The local sensing unit 110 can also include an ambient temperature sensing unit 130 and a moisture sensing unit 150. The bolt temperature sensor 122 is disposed in a location so that it can sense the temperature of the bolt 16. In one embodiment, the transceiver includes a mesh network transceiver 124 (such as a Zigbee mesh network transceiver) that communicates with the central server unit 160 through mesh network 140. Each local sensing unit includes a memory that stores a unique identifier that is transmitted with the bolt temperature data to the central server unit 160.

The ambient temperature sensing unit 130 includes an ambient temperature sensor 132 and a transceiver 134 that is configured to communicate ambient temperature data to the central server unit 160. It is spaced apart from the bolt temperature sensing unit 120 so as to be able to detect an ambient temperature of the space around the bolt 16. The moisture sensing unit 150 includes a moisture sensor 152 that is also configured to communicate ambient temperature data to the central server unit 160. The ambient temperature sensing unit 130 and the moisture sensing unit 150 allow the processor 162 to make determinations about the temperature of the bolt 16 in view of both the ambient temperature and the moisture of the air in the vicinity of the bolt 16 so as to detect abnormalities in the temperature of the bolt 16, which might indicate an improperly secured bolt 16.

Figure 2:
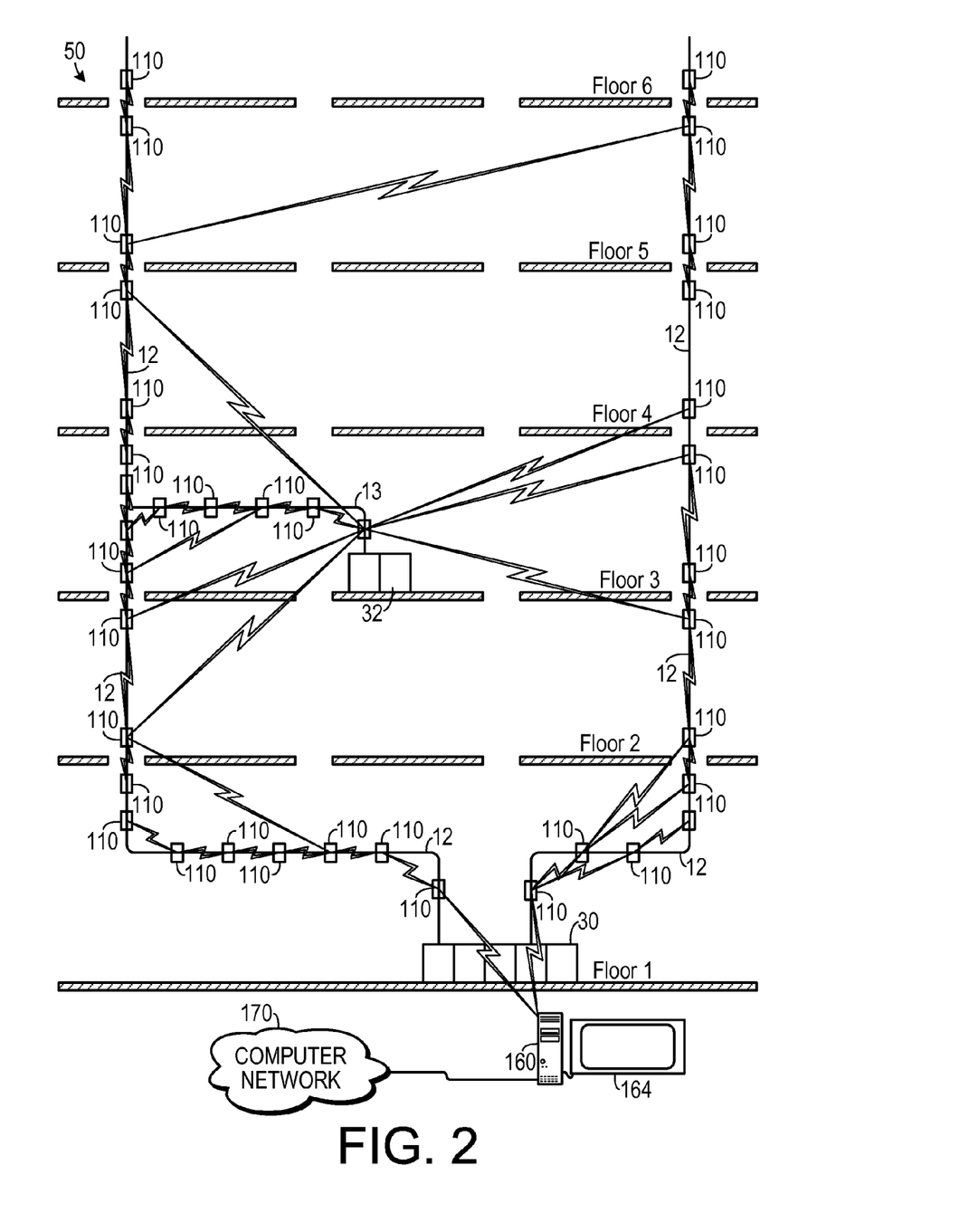
FIG. 2 is a schematic diagram of a building using a busway joint parameter detection system.

As shown in FIG. 2, a bolt sensing unit 110 can be applied to each bolt used to couple busway segments 12 in a busway system distributed throughout a multi-storied building 50 or large area facility. As shown in this embodiment two multi-floor busway systems 12 are fed from a central power distribution unit 30 and a single-floor plug-in busway system 13 taps power from one of the multi-floor busway systems 12 and feeds power a distribution box 32 on one of the floors, for further distribution to lighting circuits, power outlets, and the like. (It should be noted that this is only one of the many busway configurations that are commonly used in buildings and is given for example only.) In this system, each bolt sensing unit 110 can communicate with several other bolt sensing units 110 throughout the building to form a mesh network. This mesh network can communicate with the central server unit 160. The mesh network configuration has the advantages of being scalable and allowing multiple interconnections between bolt sensing units 110, which allows communication even when a given interconnection becomes blocked or is otherwise not possible.

Figure 3:
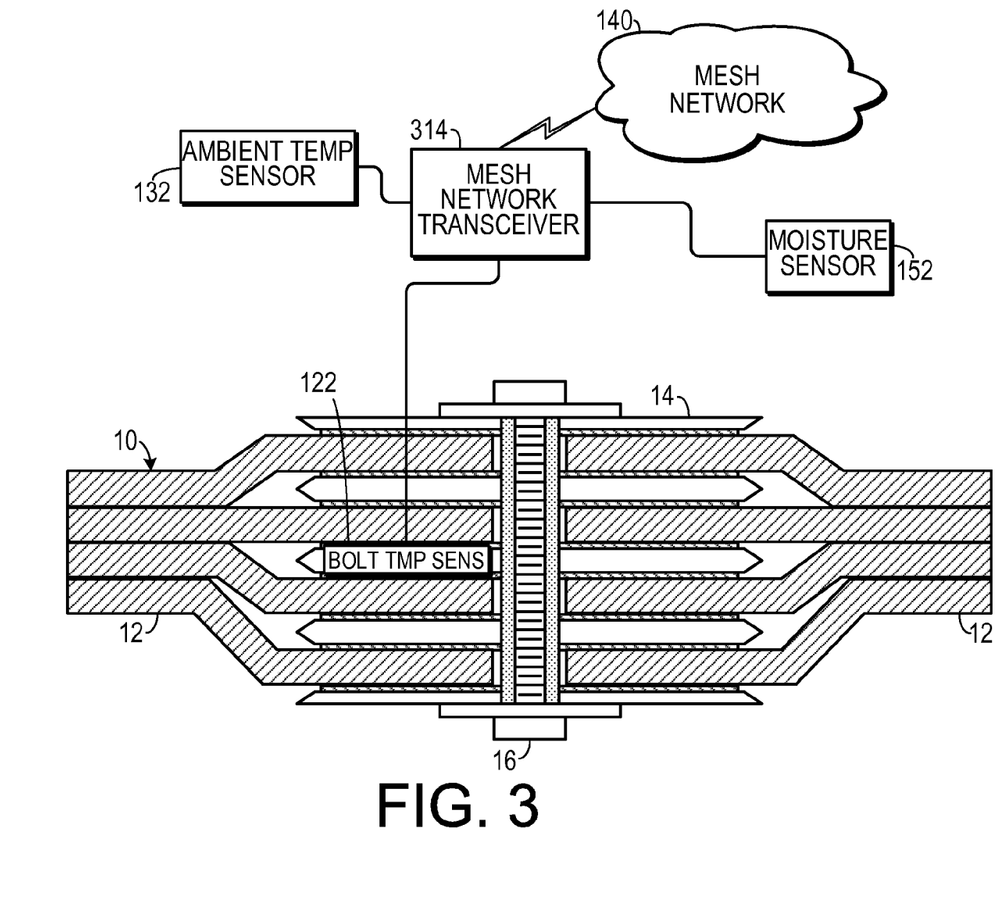
FIG. 3 is a schematic diagram of a second embodiment of a busway joint parameter detection system.

In one embodiment, as shown in FIG. 3, the bolt temperature sensor 122 can be embedded in the joint 14 so as to sense actual joint temperature. Also, this embodiment shows a single mesh network transceiver 314 that is coupled to the bolt temperature sensor 122, the ambient temperature sensor 132 and the moisture sensor 152.

Figure 4:
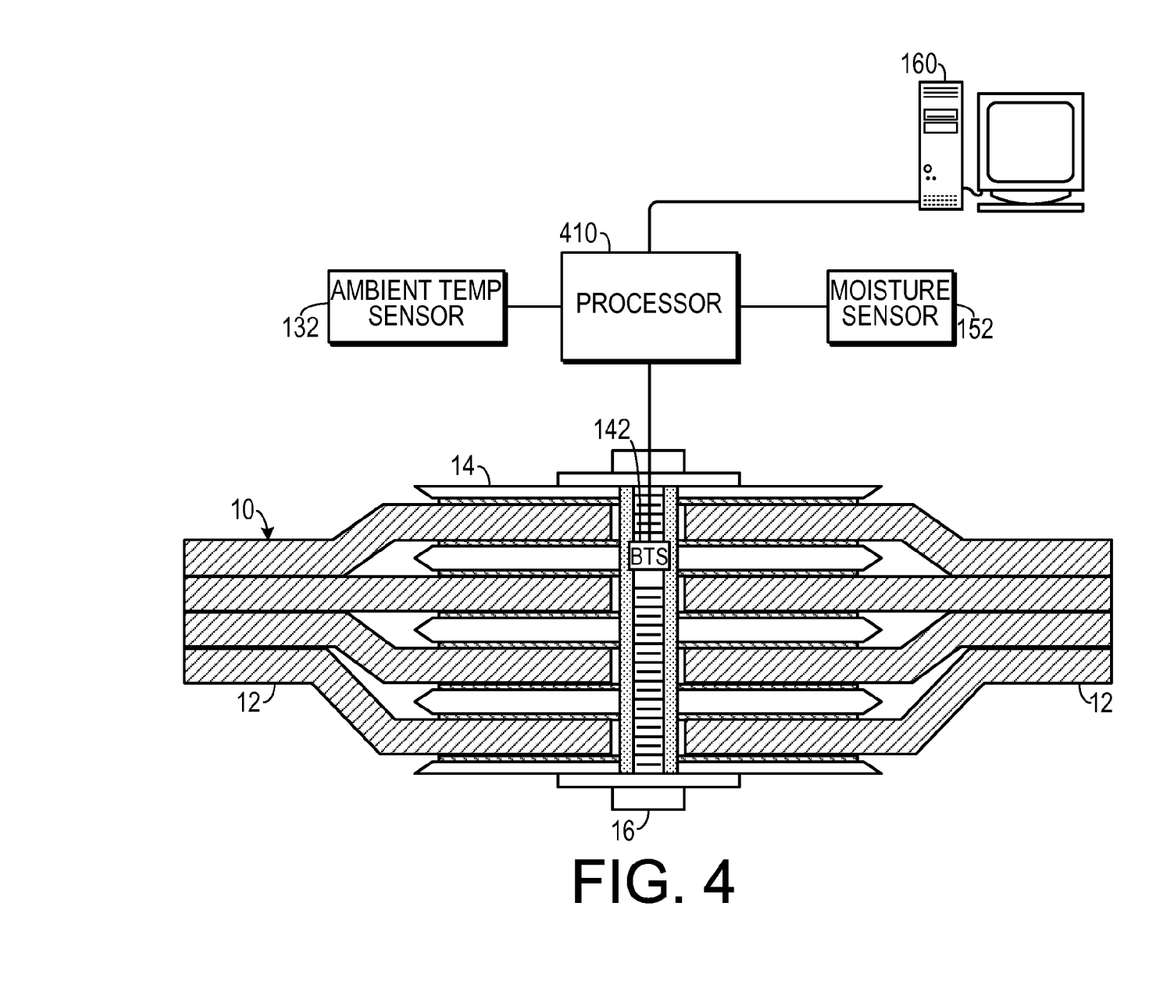
FIG. 4 is a schematic diagram of a third embodiment of a busway joint parameter detection system.

Another embodiment is shown in FIG. 4, in which the bolt temperature sensor 142 is actually embedded in a bolt 16. This embodiment also shows that a local processor 410 receives hard wired inputs from the bolt temperature sensor 142, the ambient temperature sensor 132 and the moisture sensor 152, and that the local processor 410 is hard wired to the central server 160.

Figure 5:
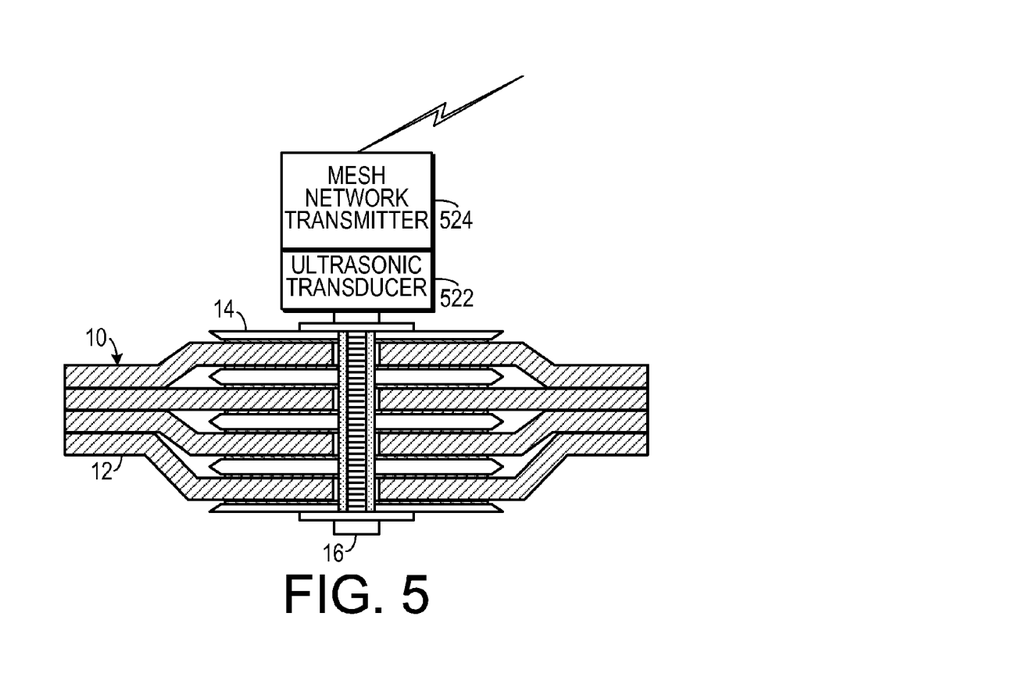
FIG. 5 is a schematic diagram of an embodiment of a busway joint bolt pre-load detection system.

Another embodiment, shown in FIG. 5, includes an ultrasonic transducer 522 that detects the preload of the bolt 16. In the embodiment shown, the ultrasonic transducer 522 is coupled to a mesh network transceiver 524 that communicates with the mesh network. However, hard wired embodiments (such as the embodiment shown in FIG. 4) could be employed with the ultrasonic transducer 522.

Figure 6:
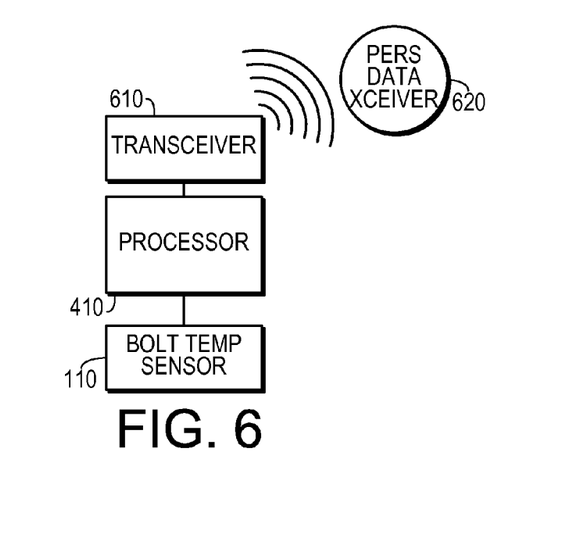
FIG. 6 is a schematic diagram of a data transmission system used in one embodiment of a busway joint parameter detection system.

As shown in FIG. 6, one embodiment uses a local data transceiver 610 coupled to a processor 410, which is coupled to the bolt temperature sensor 110 to transmit temperature data. In this embodiment, a technician would use a personal data transceiver 620 to record bolt temperature data locally and then download the data to the central server. One example of a suitable personal data transceiver 620 would include a device such as a Dallas iButton device. This embodiment would require the technician to make periodic rounds to sense bolt temperatures. However, it might be preferable in situations where hard wiring and central wireless communications are not practical.

Since busway joints that are loose will inevitably generate heat, busway joint temperature is a key indicator of the condition of the joint. Busway joints, however, will have a normal range of temperatures from ambient up to about 55° C. above ambient, depending on the load current that is flowing through it and how long it has been flowing. Thus, a temperature rise above 55° C. is out of range if the instantaneous current flowing through the joint may not be considered. A joint can be overheating at a temperature much lower than this if the actual load current is taken into consideration. For instance, if for a given load current, the joint should be operating at 10° C. rise, but the joint is actually at a 20° C. rise, this indicates a joint in trouble that will continue to degrade, ultimately to failure. The invention includes a system configured to monitor the temperature of the bus joints on a continuous basis. A temperature sensor or sensors are positioned on the exterior of the busway near each joint contact area. If a busway includes two or three bar packages, then two or three sensors will be utilized. An ambient temperature monitoring sensor will also be deployed so that a temperature rise may be calculated. The temperature data will be transmitted either wirelessly or via a wired circuit to a central monitoring processor. That processor will execute an expert software system to calculate the expected temperature for the measured load current at that time. In one embodiment, the system will also trend the data so that any shift from the past load-temperature operating curve can be detected.

Each supervisory system could monitor several busways and present real-time graphic displays and well as historical trend analysis. Specific interface software could provide a communications link to various building management system (BMS) software to provide a seamless monitoring solution. Also, for high-ampacity busways with multiple (two or three) bar packages, the total current typically divides evenly among the bar package joints. Thus, the temperature rise should be the same on each bar package of the joint. By monitoring the multiple components of the multi-bar joints, the system can detect if one bar package area begins to rise above the others, indicating that one of the bolts is loosening.

A busway will usually be a linear system and configured either as a feeder busway (no taps, with all the current going from one end to the other) or as a plug-in busway (plug-in taps that allow takeoff of current at various locations, such as floor feeders in a high-rise building). Since a feeder busway has the same current throughout, all of the joints should have very similar temperature rises. The system would detect if any of the joints begin to rise above the others. On a plug-in busway, the load current continuing on the busway will be reduced by the amount of current tapped at each plug-in. Thus, with each joint rising up the busway, the through-current will be decrementing and the temperature rises should be decrementing. The system would detect if a joint temperature rise increments rather than decrements and would then flag a problem. Temperature measurement of operating equipment, both locally and remotely monitored, is well established.

In the system, not only are the temperatures monitored relative to equipment operating conditions, but the system also evaluates the temperatures of the various parts of the system in relation to each other given their physical installation conditions. Also, the system compares the temperatures within a multi-bar joint to assure even heating and thus consistent joint clamping force.

One embodiment of the system utilizes a mesh network to communicate among the various sensing units. Mesh networks such as those based on industry standard IEEE 802.15.3 are well known and can form the basis of a self-organizing, self-healing network which operates with high reliability and minimum power requirements. Typically, a small battery can support the devices for a period of five or more years. The mesh network would allow for an inexpensive installation without the need to drill through multiple floors in a high-rise building. Also, no installation of power sources would be required. The mesh network transponders would operate efficiently since they would necessarily be located every 10 to 20 feet along the busway being monitored.

An alternate embodiment would utilize a wired communication scheme to access the temperature data. This embodiment would operate at a higher data rate but would be more expensive to install initially.

Since the communications link and sensor interface is established, any physical parameter of interest could be measured and communicated to the central monitoring system. One additional such parameter would be the presence of water or moisture at the busway joint. Insulation system failure due to intrusion of water or other liquids is a common cause of busway failure. The monitoring system can alert building personnel immediately upon detection of liquid presence so that emergency response procedures could be initiated to limit damage to the busway.

As a tertiary benefit, the system can detect the sudden temperature rise due to an arcing fault in a busway joint. Most new busways are provided with ground fault protection which will remove the fault from the system. Older systems however may not utilize ground fault protection, and it is not uncommon for an arcing fault to persist for many minutes, causing great damage, due to the system impedances involved. Many times a fuse or thermo-magnetic circuit breaker won't operate to clear such a fault. The system could be interfaced with a shunt trip switch operator or breaker to trip the feeder device in the event of fault detection. This would be backup protection and would not be considered as a first line of circuit protection.

Another component of the system would be the inclusion of joint bolts fitted with ultrasonic transducers similar to the i-Bolt® (available from Load Control Technologies, www.innovationplus.com). This is a mature technology that has been utilized in the aerospace and automotive industries for some time. The i-Bolt is measured ultrasonically while in a relaxed, non-tensioned state and then is tightened while being monitored by an ultrasonic monitor to determine the exact bolt pre-load or stress. This pre-load is a direct variable which determines the clamping force of the splice plates. Utilizing torque as the measured variable may not always be accurate, as there are a number of variables that may be difficult to control during installation that could result in a specific target torque not resulting in the desired target clamping pressure. Employing an i-Bolt type system allows a follow-up check of the bolt pre-load (and thus joint clamping pressure) that could be performed while the busway is energized.

In one embodiment, the system compares joint temperatures between joints closer to the source with those more remote from the source. In one embodiment, the system compares the temperature of one group of bars, in a joint, with one or more additional groups of bars in that joint. All groups should share current equally and thus should have similar operating temperatures. A departure of a single group could mean a problematic joint.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. An electrical distribution busway system, comprising:
   a. a busway joint that couples two segments of the electrical distribution busway to each other;
   b. a busway joint parameter sensor coupled to the busway joint and configured to sense a selected parameter of the busway joint;
   c. a transmission circuit in data communication with the busway joint parameter sensor and configured to transmit real time busway joint parameter data; and
   d. a remote computer in data communication with the transmission circuit and configured to present an indication upon detection of abnormal real time busway joint parameter data.

2. The system of claim 1, wherein the busway joint parameter sensor comprises a joint temperature sensor configured to detect a joint temperature of the busway joint, wherein the real time busway joint parameter data is abnormal when the joint temperature is greater than an estimated normal operating temperature by a predetermined amount.

3. The system of claim 2, further comprising an ambient temperature sensor, spaced apart from the joint temperature sensor, configured to sense an ambient temperature of an environment in which the busway joint is disposed and wherein the remote computer is configured to calculate the estimated normal operating temperature based, at least in part, on the ambient temperature.

4. The system of claim 2, wherein the remote computer is configured to calculate the estimated normal operating temperature by:
   a. determining an amount of current that flows through the busway; and
   b. adjusting the estimated normal operating temperature by an amount corresponding to the amount of current that flows through the busway.

5. The system of claim 2, wherein the remote computer is configured to calculate the estimated normal operating temperature by adjusting the estimated normal operating temperature based in part on current flowing through the busway.

6. The system of claim 1, wherein the busway joint includes a bolt and wherein the parameter sensor comprises an ultrasonic transducer coupled to the bolt and configured to detect a pre-load of the bolt.

7. The system of claim 1, further comprising a current sensor configured to detect a current flowing through the busway, wherein the remote computer is configured to determine when the joint temperature is greater than a predicted joint temperature corresponding to the current.

8. The system of claim 1, wherein the transmission circuit comprises a mesh network transmitter configured to transmit data to the remote computer via a mesh network.

9. The system of claim 1, wherein the transmission circuit comprises a processor that is hard wired to the remote computer.

10. A method of detecting an improperly secured busway joint, comprising the steps of:
    a. continuously sensing a parameter of the busway joint, wherein the busway joint couples two segments of an electrical distribution busway to each other, with a busway joint parameter sensor that is disposed adjacent to the busway joint;
    b. transmitting data regarding the parameter to a remote computer;
    c. determining with the computer when the data indicates that the parameter is abnormal; and
    d. presenting an indication on a computer interface when the parameter is abnormal.

11. The method of claim 10, wherein the parameter sensor comprises a temperature sensor configured to sense a joint temperature of the busway joint and wherein the determining step comprises the step of:
    a. comparing the joint temperature to an estimated normal operating temperature; and
    b. indicating that the parameter is abnormal when the joint temperature is above the estimated normal operating temperature by a predetermined amount.

12. The method of claim 11, further comprising the steps of:
    a. determining a joint current flowing through the joint; and
    b. calculating with the computer the estimated normal operating temperature based, at least in part, on the joint current.

13. The method of claim 11, wherein the determining step further comprises the steps of:
    a. measuring an ambient temperature at a predetermined distance away from the joint; and
    b. calculating with the computer the estimated normal operating temperature based, at least in part, on the ambient temperature.

14. The method of claim 11, further comprising the steps of calculating the estimated normal operating temperature by:
    a. determining an amount of current that is flowing through the busway; and
    b. adjusting the estimated normal operating temperature by an amount corresponding to the amount of current that is flowing through the busway.

15. The method of claim 11, further comprising the steps of:
    a. determining an estimated amount of current flowing through the busway joint; and
    b. calculating the estimated normal operating temperature by adjusting the estimated normal operating temperature based in part on the estimated amount of current flowing through the busway joint.

16. The method of claim 10, wherein the step of transmitting data comprises the step of transmitting the data to a mesh network that is in data communication with the computer.

17. The method of claim 10, wherein the step of transmitting data comprises the step of transmitting the data to the computer via a hard wired data bus.

18. The method of claim 10, wherein the joint includes a bolt and the method further comprising the step of detecting a pre-load in the bold using an ultrasonic transducer coupled to the bolt.

19. A method of detecting an improperly secured busway joint in an electrical distribution busway, comprising the steps of:
    a. continuously sensing a parameter of the busway joint with a busway joint parameter sensor that is disposed adjacent to the busway joint;
    b. transmitting data regarding the parameter to a remote computer;
    c. determining with the computer when the data indicates that the parameter is abnormal;
    d. presenting an indication on a computer interface when the parameter is abnormal;
    e. detecting a change in an estimated amount of current flowing through the busway joint;
    f. detecting an actual lag between the change in the estimated amount of current flowing through the busway joint and a change in joint temperature;

g. comparing the lag to an expected lag corresponding to the change in the estimated amount of current flowing through the busway joint and the change in joint temperature; and h. generating a lag abnormality indicator when the actual lag is different from the expected lag by a predetermined amount.

20. The method of claim 19, wherein the step of transmitting data comprises the step of transmitting the data to a mesh network that is in data communication with the computer.

21. The method of claim 19, wherein the parameter sensor comprises a temperature sensor configured to sense a joint temperature of the busway joint and wherein the determining step comprises the step of:

a. comparing the joint temperature to an estimated normal operating temperature; and b. indicating that the parameter is abnormal when the joint temperature is above the estimated normal operating temperature by a predetermined amount.

22. The method of claim 21, further comprising the steps of:

a. determining a joint current flowing through the joint; and b. calculating with the computer the estimated normal operating temperature based, at least in part, on the joint current.

23. The method of claim 21, wherein the determining step further comprises the steps of:

a. measuring an ambient temperature at a predetermined distance away from the joint; and b. calculating with the computer the estimated normal operating temperature based, at least in part, on the ambient temperature.

24. The method of claim 21, further comprising the steps of:

a. determining an estimated amount of current flowing through the busway joint; and b. calculating the estimated normal operating temperature by adjusting the estimated normal operating temperature based in part on the estimated amount of current flowing through the busway joint.

* * * * *